United States Patent
Lee et al.

(10) Patent No.: US 11,062,757 B1
(45) Date of Patent: Jul. 13, 2021

(54) DATA RECEIVING DEVICE, A SEMICONDUCTOR APPARATUS, AND A SEMICONDUCTOR SYSTEM USING THE DATA RECEIVING DEVICE

(71) Applicant: SK hynix Inc., Icheon-si (KR)

(72) Inventors: Doo Bock Lee, Icheon-si (KR); Yong Suk Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/928,866

(22) Filed: Jul. 14, 2020

(30) Foreign Application Priority Data

Jan. 30, 2020 (KR) .................. 10-2020-0010948

(51) Int. Cl.

| | | |
|---|---|---|
| *G11C 11/4076* | (2006.01) | |
| *G11C 11/4074* | (2006.01) | |
| *G11C 7/22* | (2006.01) | |
| *G11C 7/10* | (2006.01) | |
| *G11C 8/18* | (2006.01) | |
| *G11C 11/4093* | (2006.01) | |
| *G11C 11/4099* | (2006.01) | |

(52) U.S. Cl.
CPC ........ *G11C 11/4076* (2013.01); *G11C 7/1078* (2013.01); *G11C 7/1084* (2013.01); *G11C 7/22* (2013.01); *G11C 7/222* (2013.01); *G11C 7/225* (2013.01); *G11C 8/18* (2013.01); *G11C 11/4074* (2013.01); *G11C 11/4093* (2013.01); *G11C 11/4099* (2013.01)

(58) Field of Classification Search
CPC ....... G11C 7/1078; G11C 7/1084; G11C 7/22; G11C 7/222; G11C 7/225; G11C 11/4076; G11C 11/4074; G11C 11/4092; G11C 11/4099; G11C 8/18
USPC .............. 365/189.05, 233.1, 233.11, 233.12, 365/233.13
See application file for complete search history.

(56) References Cited

U.S. PATENT DOCUMENTS

| | | | | |
|---|---|---|---|---|
| 5,751,176 A | * | 5/1998 | Sohn ....................... | H03K 5/151 327/257 |
| 6,448,828 B2 | * | 9/2002 | Stark ....................... | H03K 5/151 327/170 |
| 6,535,032 B2 | * | 3/2003 | Harrison .............. | G11C 7/1078 327/563 |

(Continued)

FOREIGN PATENT DOCUMENTS

KR 100355227 B1 10/2002

*Primary Examiner* — Son L Mai
(74) *Attorney, Agent, or Firm* — William Park & Associates Ltd.

(57) ABSTRACT

A data receiving device includes a clock receiver and a plurality of data receivers. The clock receiver is configured to generate a plurality of internal clock signals from a clock signal and a complementary clock signal based on a switching enable signal. The plurality of data receivers are configured to receive data and a reference voltage and compare the data with the reference voltage in synchronization with the plurality of internal clock signals, respectively, to generate first internal data. Among the plurality of data receivers, a data receiver receiving an internal clock signal, of which a logic level transitions signals when a logic level of the switching enable signal transitions, is configured to change a voltage level of the reference voltage when the logic level of the switching enable signal transitions.

16 Claims, 8 Drawing Sheets

(56) References Cited

U.S. PATENT DOCUMENTS

| | | | | |
|---|---|---|---|---|
| 6,762,623 | B2* | 7/2004 | Suryanarayana | ... H04L 25/0292 |
| | | | | 326/105 |
| 6,803,792 | B2* | 10/2004 | Yasuda | ............ H03K 19/00323 |
| | | | | 326/93 |
| 7,823,003 | B1* | 10/2010 | Cheng | ................ H03K 19/0002 |
| | | | | 713/600 |
| 10,140,028 | B2* | 11/2018 | Gillingham | ......... G06F 13/1694 |

* cited by examiner

DATA RECEIVING DEVICE, A SEMICONDUCTOR APPARATUS, AND A SEMICONDUCTOR SYSTEM USING THE DATA RECEIVING DEVICE

CROSS-REFERENCES TO RELATED APPLICATION

The present application claims priority under 35 U.S.C. § 119(a) to Korean application number 10-2020-0010948, filed on Jan. 30, 2020, in the Korean Intellectual Property Office, which is incorporated herein by reference in its entirety as set forth in full.

BACKGROUND

1. Technical Field

Various embodiments relate to an integrated circuit technology and, more particularly, to a data receiving device and a semiconductor apparatus and a semiconductor system using the same.

2. Related Art

An electronic device includes many electronic elements, and a computer system includes many semiconductor apparatuses each including a semiconductor. Semiconductor apparatuses configuring a computer system may communicate with each other by receiving and transmitting data and a clock signal. The semiconductor apparatuses may operate in synchronization with a clock signal. The semiconductor apparatuses may output data in synchronization with a clock signal. The semiconductor apparatuses may receive data in synchronization with the clock signal. The data may be transmitted as a differential signal or as a single-ended signal. When the data is transmitted as a single-ended signal, the semiconductor apparatus may determine a logic level of the data utilizing a reference voltage.

As transistor-based semiconductor apparatus becomes miniaturized, the semiconductor apparatus may easily deteriorate. Bias Temperature Instability (BTI) is one of the most representative examples of the deterioration of a miniaturized semiconductor apparatus. BTI may raise a threshold voltage and thus may decrease an operation speed of a semiconductor apparatus and shorten the product life of the semiconductor apparatus.

SUMMARY

In an embodiment, a data receiving device may include a clock receiver, a first data receiver, and a second data receiver. The clock receiver may be configured to generate a first reception clock signal and a second reception clock signal from a clock signal and a complementary clock signal based on a switching enable signal. The clock receiver may be configured to change a logic level of the first reception clock signal when a logic level of the switching enable signal transitions. The first data receiver may be configured to compare data with a reference voltage in synchronization with the first reception clock signal to generate first internal data. The second data receiver may be configured to compare the data with the reference voltage in synchronization with the second reception clock signal to generate second internal data and may compensate for a voltage level change of the reference voltage based on the switching enable signal.

In an embodiment, a data receiving device may include a clock receiver and a plurality of data receivers. The clock receiver may be configured to generate a plurality of internal clock signals from a clock signal and a complementary clock signal based on a switching enable signal. The plurality of data receivers may be configured to receive data and a reference voltage and may compare the data and the reference voltage in synchronization with the plurality of internal clock signals, respectively, to generate a plurality of internal data. Among the plurality of data receivers, a data receiver receiving an internal clock signal, of which a logic level transitions when a logic level of the switching enable signal transitions, may change a voltage level of the reference voltage when the logic level of the switching enable signal transitions.

In an embodiment, a semiconductor apparatus may include a strobe receiving circuit, a first data receiver, and a second data receiver. The strobe receiving circuit may be configured to generate a first internal strobe signal and a second internal strobe signal from a data strobe signal and a complementary data strobe signal based on a switching enable signal. The first data receiver may be configured to compare data with a reference voltage in synchronization with the first internal strobe signal to generate first internal data. The second data receiver may be configured to compare the data with the reference voltage in synchronization with the second internal strobe signal to generate second internal data. The second data receiver may be configured to compensate for a voltage level change of the reference voltage based on the switching enable signal.

DETAILED DESCRIPTION

Figure 1:
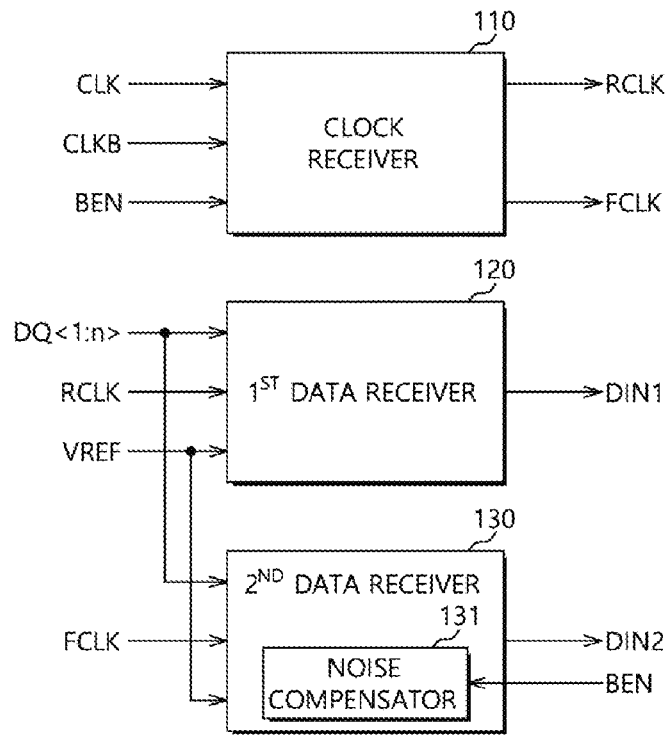
FIG. 1 is a diagram illustrating a configuration of a data receiving device in accordance with an embodiment.

FIG. 1 is a diagram illustrating configuration of a data receiving device 100 in accordance with an embodiment. Referring to FIG. 1, the data receiving device 100 may receive data DQ<1:n> and a clock signal CLK. The data receiving device 100 may receive the data DQ<1:n> in synchronization with the clock signal CLK to generate an internal data signal. The data DQ<1:n> may be one data stream including a plurality of data signals. The plurality of data signals may be serially and consecutively transmitted through one data transmission line. The data DQ<1:n> may include n number of data signals, where n is an integer equal to or greater than 2. The data DQ<1:n> may be a single-ended signal. The data receiving device 100 may utilize a reference voltage VREF in order to receive the data DQ<1:n> transmitted as a single-ended signal. The reference voltage VREF may have a voltage level corresponding to a middle of a range that the data DQ<1:n> swings. Edges of the clock signal CLK may be synchronized with phases of the data DQ<1:n>. The clock signal CLK may be a differential signal. The data receiving device 100 may receive a complementary clock signal CLKB together with the clock signal CLK. The complementary clock signal CLKB may have an opposite phase to the clock signal CLK.

The data receiving device 100 may include a clock receiver 110, a first data receiver 120, and a second data receiver 130. The clock receiver 110 may receive the clock signal CLK and the complementary clock signal CLKB. The clock receiver 110 may generate a first reception clock signal RCLK and a second reception clock signal FCLK based on the clock signal CLK and the complementary clock signal CLKB. The first reception clock signal RCLK may have a phase corresponding to the clock signal CLK. The second reception clock signal FCLK may have a phase corresponding to the complementary clock signal CLKB. The clock receiver 110 may differentially amplify the clock signal CLK and the complementary clock signal CLKB to generate the first reception clock signal RCLK and the second reception clock signal FCLK. The clock receiver 110 may further receive a switching enable signal BEN. The clock receiver 110 may generate, based on the switching enable signal BEN, the first reception clock signal RCLK, and the second reception clock signal FCLK from the clock signal CLK and the complementary clock signal CLKB. The clock receiver 110 may generate, when the switching enable signal BEN is disabled, the first reception clock signal RCLK and the second reception clock signal FCLK having the same logic level even though the clock signal CLK and the complementary clock signal CLKB have different logic levels. As described later, when the first reception clock signal RCLK and the second reception clock signal FCLK keep having the same logic level, a mismatch between the first data receiver 120 and the second data receiver 130 due to deterioration may be prevented.

When the switching enable signal BEN is enabled, the clock receiver 110 may generate the first reception clock signal RCLK from the clock signal CLK and may generate the second reception clock signal FCLK from the complementary clock signal CLKB. The first reception clock signal RCLK and the second reception clock signal FCLK may have the same logic level when the switching enable signal BEN is disabled. Therefore, the logic level of one between the first reception clock signal RCLK and the second reception clock signal FCLK may transition when the switching enable signal BEN is enabled. After that, the logic level of one between the first reception clock signal RCLK and the second reception clock signal FCLK may transition when the switching enable signal BEN is disabled. For example, the clock receiver 110 may generate the first reception clock signal RCLK and the second reception clock signal FCLK having a logic low level when the switching enable signal BEN is disabled. When the switching enable signal BEN is enabled, the first reception clock signal RCLK may keep having a logic low level and the second reception clock signal FCLK may transition to have a logic high level. When the switching enable signal BEN is disabled, the clock receiver 110 may generate the first reception clock signal RCLK and the second reception clock signal FCLK to have a logic low level again.

The first data receiver 120 may receive the data DQ<1:n>, the reference voltage VREF, and the first reception clock signal RCLK. The first data receiver 120 may compare the data DQ<1:n> with the reference voltage VREF in synchronization with the first reception clock signal RCLK to generate a first internal data signal DIN1. The second data receiver 130 may receive the data DQ<1:n>, the reference voltage VREF, and the second reception clock signal FCLK. The second data receiver 130 may compare the data DQ<1:n> with the reference voltage VREF in synchronization with the second reception clock signal FCLK to generate a second internal data signal DIN2. The second data receiver 130 may further receive the switching enable signal BEN. The second data receiver 130 may compensate for a voltage level change of the reference voltage VREF based on the switching enable signal BEN.

The second data receiver 130 may compensate for a voltage level of the reference voltage VREF when a logic level of the switching enable signal BEN transitions. The second reception clock signal FCLK may transition when a logic level of the switching enable signal BEN transitions. When the second reception clock signal FCLK transitions, a kick-back noise may occur and a voltage level of the reference voltage VREF may change due to the kick-back noise. The second data receiver 130 may include a noise compensator 131 in order to compensate for the kick-back noise. The noise compensator 131 may receive the switching enable signal BEN. The noise compensator 131 may change a voltage level of the reference voltage VREF when a logic level of the switching enable signal BEN changes. For example, when the switching enable signal BEN is enabled, the noise compensator 131 may raise a voltage level of the reference voltage VREF in order to compensate for voltage level drop of the reference voltage VREF. When the switching enable signal BEN is disabled, the noise compensator 131 may lower a voltage level of the reference voltage VREF in order to compensate for voltage level rise of the reference voltage VREF. The first data receiver 120 may receive the first reception clock signal RCLK. A logic level of the first reception clock signal RCLK may stay without transition even when a logic level of the switching enable signal BEN transitions. Therefore, the kick-back noise might not occur in the first data receiver 120 even when a logic level of the switching enable signal BEN transitions. The first data receiver 120 might not include a noise compensator for compensating for level change of the reference voltage VREF, which is different from the second data receiver 130. According to the first data receiver 120 without a noise compensator, an occupied circuit space of the data receiving device 100 may be reduced and power consumption of the data receiving device 100 may be reduced.

Figure 2:
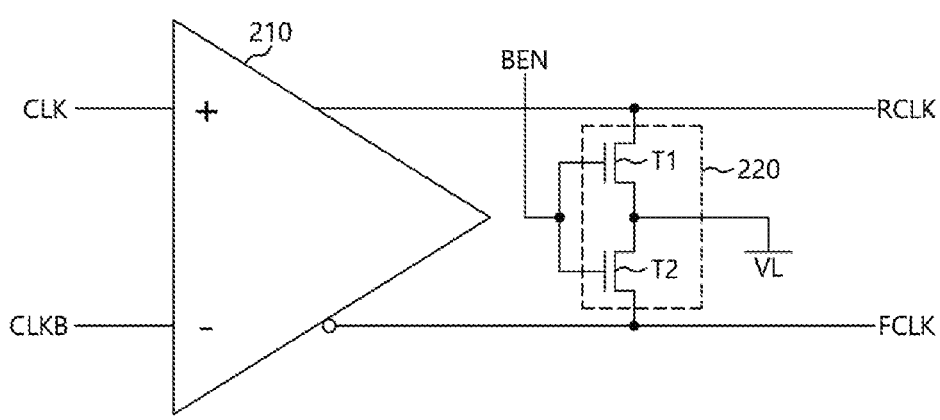
FIG. 2 is a diagram illustrating a configuration of a clock receiver illustrated in FIG. 1.

FIG. 2 is a diagram illustrating configuration of the clock receiver 110 illustrated in FIG. 1. Referring to FIG. 2, the clock receiver 110 may include a clock buffer circuit 210 and a deterioration preventing circuit 220. The clock buffer circuit 210 may receive the clock signal CLK and the complementary clock signal CLKB. The clock buffer circuit 210 may differentially amplify the clock signal CLK and the complementary clock signal CLKB to generate the first reception clock signal RCLK and the second reception clock signal FCLK. The clock buffer circuit 210 may receive the clock signal CLK through a positive input node and may receive the complementary clock signal CLKB through a negative input node. The clock buffer circuit 210 may output the first reception clock signal RCLK through a positive output node and may output the second reception clock signal FCLK through a negative output node.

The deterioration preventing circuit 220 may receive the switching enable signal BEN. The deterioration preventing circuit 220 may control, based on the switching enable signal BEN, the first reception clock signal RCLK and the second reception clock signal FCLK to have the same logic level. For example, when the switching enable signal BEN is disabled, the deterioration preventing circuit 220 may couple the positive output node and the negative output node of the clock buffer circuit 210 to each other and may drive the positive output node and the negative output node of the clock buffer circuit 210 to a voltage level of a first power voltage VL. The first power voltage VL may have a voltage level low enough to be determined as a logic low level. The deterioration preventing circuit 220 may release, when the switching enable signal BEN is enabled, the coupling between the positive output node and the negative output node of the clock buffer circuit 210. Therefore, the first reception clock signal RCLK may have a logic level corresponding to the clock signal CLK and the second reception clock signal FCLK may have a logic level corresponding to the complementary clock signal CLKB.

The deterioration preventing circuit 220 may include a first transistor T1 and a second transistor T2. The switching enable signal BEN may be enabled to a logic low level. Each of the first transistor T1 and the second transistor T2 may be an N-channel MOS transistor. The first transistor T1 may be coupled between the positive output node of the clock buffer circuit 210 and a node, to which the first power voltage VL is provided, and may receive the switching enable signal BEN at its gate. The second transistor T2 may be coupled between the negative output node of the clock buffer circuit 210 and the node, to which the first power voltage VL is provided, and may receive the switching enable signal BEN at its gate.

Figure 3:
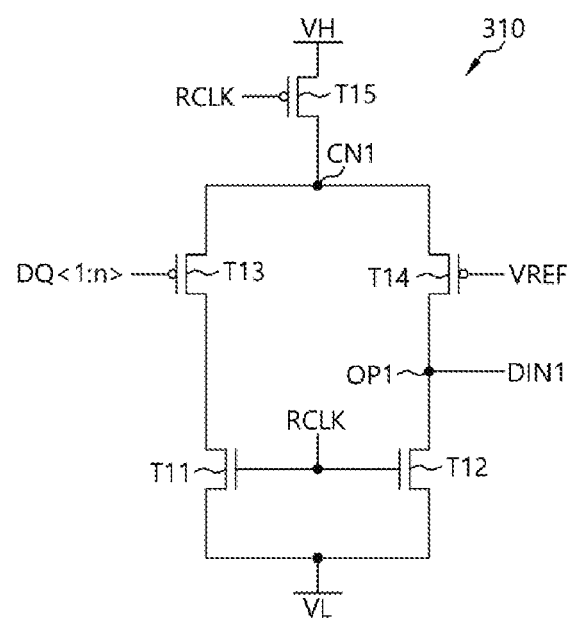
FIG. 3 is a diagram illustrating a configuration of a first data receiver illustrated in FIG. 1.

FIG. 3 is a diagram illustrating configuration of the first data receiver 120 illustrated in FIG. 1. Referring to FIG. 3, the first data receiver 120 may include a data buffer circuit 310. The data buffer circuit 310 may receive the data DQ<1:n>, the reference voltage VREF, and the first reception clock signal RCLK and may output the first internal data signal DIN1. The data buffer circuit 310 may differentially amplify the data DQ<1:n> and the reference voltage VREF in synchronization with the first reception clock signal RCLK to generate the first internal data signal DIN1. For example, the data buffer circuit 310 may differentially amplify the data DQ<1:n> and the reference voltage VREF in synchronization with a rising edge of the first reception clock signal RCLK to generate the first internal data signal DIN1.

The data buffer circuit 310 may include a first transistor T11, a second transistor T12, a third transistor T13, a fourth transistor T14, and a fifth transistor T15. Each of the first transistor T11 and the second transistor T12 may be an N-channel MOS transistor. Each of the third transistor T13, the fourth transistor T14, and the fifth transistor T15 may be a P-channel MOS transistor. The first transistor T11 may be coupled to the node, to which the first power voltage VL is provide, at its source and may receive the first reception clock signal RCLK at its gate. The second transistor T12 may be coupled to a first output node OP1 at its drain, may be coupled to the node, to which the first power voltage VL is provided, at its source and may receive the first reception clock signal RCLK at its gate. The first internal data signal DIN1 may be output through the first output node OP1. The third transistor T13 may be coupled to a first common node CN1 at its source, may be coupled to the drain of the first transistor T11 at its drain, and may receive the data DQ<1:n> at its gate. The fourth transistor T14 may be coupled to the first common node CN1 at its source, may be coupled to the first output node OP1 at its drain, and may receive the reference voltage VREF at its gate. The fifth transistor T15 may be coupled to a node, to which a second power voltage VH is provided, at its source, may be coupled to the first common node CN1 at its drain, and may receive the first reception clock signal RCLK at its gate.

A logic level of the first reception clock signal RCLK may stay without transition even when a logic level of the switching enable signal BEN transitions. Therefore, the kick-back noise might not occur in the data buffer circuit 310 receiving the first reception clock signal RCLK and there may be no need to compensate for a voltage level of the reference voltage VREF even when a logic level of the switching enable signal BEN transitions. When the first reception clock signal RCLK has a logic low level, the data buffer circuit 310 may be deactivated. When the first reception clock signal RCLK has a logic high level, the first transistor T11 and the second transistor T12 may be turned on and the data buffer circuit 310 may be activated. When a voltage level of the data DQ<1:n> is higher than a voltage level of the reference voltage VREF, a voltage level of the first output node OP1 may become relatively high and the first internal data signal DIN1 having a logic high level may be generated through the first output node OP1. When a voltage level of the data DQ<1:n> is lower than a voltage level of the reference voltage VREF, a voltage level of the first output node OP1 may become relatively low and the first internal data signal DIN1 having a logic low level may be generated through the first output node OP1.

Figure 4:
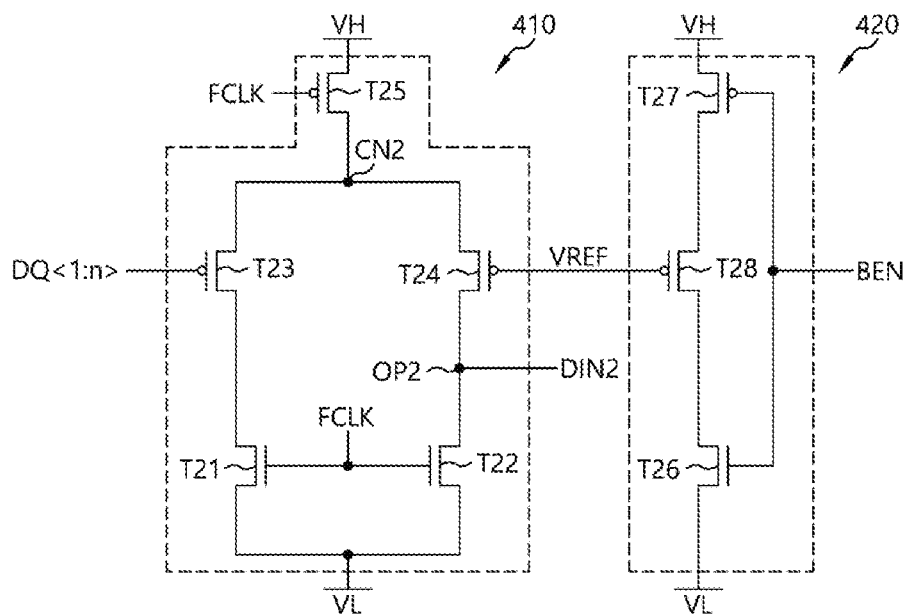
FIG. 4 is a diagram illustrating a configuration of a second data receiver illustrated in FIG. 1.

FIG. 4 is a diagram illustrating configuration of the second data receiver 130 illustrated in FIG. 1. Referring to FIG. 3, the second data receiver 130 may include a data buffer circuit 410 and a noise compensator 420. The data buffer circuit 410 may receive the data DQ<1:n>, the reference voltage VREF, and the second reception clock signal FCLK and may output the second internal data signal DIN2. The data buffer circuit 410 may differentially amplify the data DQ<1:n> and the reference voltage VREF in synchronization with the second reception clock signal FCLK to generate the second internal data signal DIN2. For example, the data buffer circuit 410 may differentially amplify the data DQ<1:n> and the reference voltage VREF in synchronization with a rising edge of the second reception clock signal FCLK to generate the second internal data signal DIN2. The noise compensator 420 may receive the switching enable signal BEN. The noise compensator 420 may change a voltage level of the reference voltage VREF based on the switching enable signal BEN.

The data buffer circuit 410 may include a first transistor T21, a second transistor T22, a third transistor T23, a fourth transistor T24, and a fifth transistor T25. Each of the first transistor T21 and the second transistor T22 may be an N-channel MOS transistor. Each of the third transistor T23, the fourth transistor T24, and the fifth transistor T25 may be a P-channel MOS transistor. The first transistor T21 may be coupled to the node, to which the first power voltage VL is provide, at its source and may receive the second reception clock signal FCLK at its gate. The second transistor T22 may be coupled to a second output node OP2 at its drain, may be coupled to the node, to which the first power voltage VL is provided, at its source, and may receive the second reception clock signal FCLK at its gate. The second internal data signal DIN2 may be output through the second output node OP2. The third transistor T23 may be coupled to a second common node CN2 at its source, may be coupled to the drain of the first transistor T21 at its drain, and may receive the data DQ<1:n> at its gate. The fourth transistor T24 may be coupled to the second common node CN2 at its source, may be coupled to the second output node OP2 at its drain, and may receive the reference voltage VREF at its gate. The fifth transistor T25 may be coupled to a node, to which a second power voltage VH is provided, at its source, may be coupled to the second common node CN2 at its drain, and may receive the second reception clock signal FCLK at its gate. The second power voltage VH may have a higher voltage level than the first power voltage VL. The second power voltage VH may have a voltage level high enough to be determined as a logic high level.

The noise compensator 420 may include a sixth transistor T26, a seventh transistor T27, and an eighth transistor T28. The sixth transistor T26 may be an N-channel MOS transistor. Each of the seventh transistor T27 and the eighth transistor T28 may be a P-channel MOS transistor. The sixth transistor T26 may be coupled to the node, to which the first power voltage VL is provided, at its source and may receive the switching enable signal BEN at its gate. The seventh transistor T27 may be coupled to a node, to which the second power voltage VH is provided, at its source and may receive the switching enable signal BEN at its gate. The eighth transistor T28 may be coupled to the drain of the seventh transistor T27 at its source, may be coupled to the drain of the sixth transistor T26 at its drain, and may receive the reference voltage VREF at its gate.

The second data receiver 130 may operate as described below. When the second reception clock signal FCLK has a logic low level, the fifth transistor T25 may be turned on and the second power voltage VH may be applied to the second common node CN2. The first transistor T21 and the second transistor T22 may be turned off and the data buffer circuit 410 may be deactivated. When the switching enable signal BEN is enabled and the second reception clock signal FCLK transitions from a logic low level to a logic high level, the first transistor T21 and the second transistor T22 may be turned on and the data buffer circuit 410 may be activated. As the second reception clock signal FCLK transitions from a logic low level to a logic high level, there may be formed a current path between the second output node OP2 and the node, to which the first power voltage VL is provided, and there may occur the kick-back noise. Due to the kick-back noise, a voltage level of the reference voltage VREF may drop. When the switching enable signal BEN is enabled to a logic low level, the seventh transistor T27 may be turned on and the second power voltage VH may be provided to the eighth transistor T28 through the seventh transistor T27. Therefore, a voltage level of the reference voltage VREF may rise through the seventh transistor T27 and the eighth transistor T28, the voltage level drop of the reference voltage VREF due to the kick-back noise may be compensated for, and the reference voltage VREF may be kept to a voltage level. When a voltage level of the data DQ<1:n> is higher than a voltage level of the reference voltage VREF, a voltage level of the second output node OP2 may become relatively high and the second internal data signal DIN2 having a logic high level may be generated through the second output node OP2. When a voltage level of the data DQ<1:n> is lower than a voltage level of the reference voltage VREF, a voltage level of the second output node OP2 may become relatively low and the second internal data signal DIN2 having a logic low level may be generated through the second output node OP2.

When the switching enable signal BEN is disabled again and the second reception clock signal FCLK transitions from a logic high level to a logic low level, the first transistor T21 and the second transistor T22 may be turned off and the data buffer circuit 410 may be deactivated. As the second reception clock signal FCLK transitions from a logic high level to a logic low level, there may be formed a current path between the node, to which the second power voltage VH is provided, and the second common node CN2 and there may occur the kick-back noise. Due to the kick-back noise, a voltage level of the reference voltage VREF may rise. When the switching enable signal BEN is disabled to a logic high level, the sixth transistor T26 may be turned on and the first power voltage VL may be provided to the eighth transistor T28 through the sixth transistor T26. Therefore, a voltage level of the reference voltage VREF may drop through the sixth transistor T26 and the eighth transistor T28, the voltage level rise of the reference voltage VREF due to the kick-back noise may be compensated for, and the reference voltage VREF may be kept to a voltage level.

Figure 5:
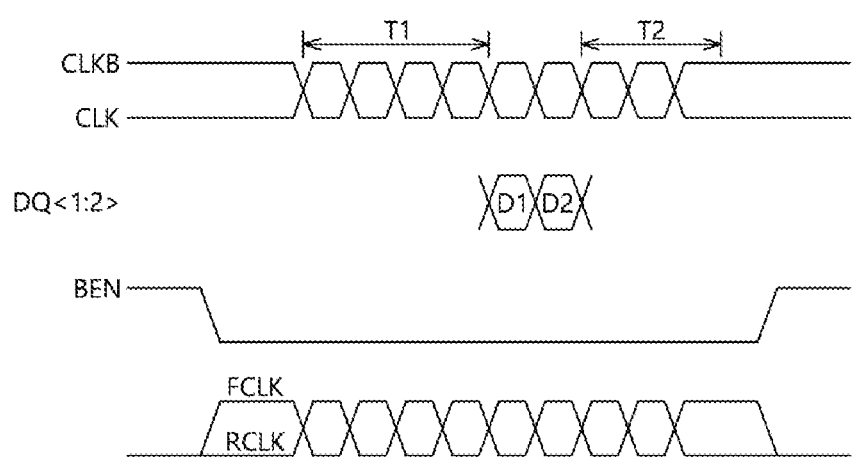
FIG. 5 is a timing diagram illustrating an operation of a data receiving device in accordance with an embodiment.

FIG. 5 is a timing diagram illustrating an operation of the data receiving device 100 in accordance with an embodiment. Hereinafter, described with reference to FIGS. 1 to 5 will be the operation of the data receiving device 100 in accordance with an embodiment. Referring to FIG. 5, it is assumed for clear description that two data signals are consecutively input to the data receiving device 100. When the data DQ<1:n> is not transmitted, each of the clock signal CLK and the complementary clock signal CLKB may have a predetermined level. The clock signal CLK may have a logic low level and the complementary clock signal CLKB may have a logic high level. The clock receiver 110 may keep, even when receiving the clock signal CLK and the complementary clock signal CLKB having different logic levels, logic levels of the first reception clock signal RCLK and the second reception clock signal FCLK to a logic low level until the switching enable signal BEN is enabled. When the switching enable signal BEN is disabled, the deterioration preventing circuit 220 may drive the first reception clock signal RCLK and the second reception clock signal FCLK through the first power voltage VL to control the first reception clock signal RCLK and the second reception clock signal FCLK to have the same logic level. As a process for a transistor configuring a transistor becomes miniaturized, the transistor may become easily deteriorated due to the Bias Temperature Instability (BTI). When the first reception clock signal RCLK and the second reception clock signal FCLK are kept to have different logic levels for a long time, there may occur difference of the deterioration due to the BTI between the first data receiver 120 and the second data receiver 130. Therefore, there may occur a mismatch in threshold voltages between the first data receiver 120 and the second data receiver 130. When the switching enable signal BEN is disabled, the clock receiver 110 may keep the same logic level of the first reception clock signal RCLK and the second reception clock signal FCLK, which may make effects of the deterioration between the first data receiver 120 and the second data receiver 130 the same as each other and may improve the mismatch between the first data receiver 120 and the second data receiver 130.

When the switching enable signal BEN is enabled to a logic low level, the deterioration preventing circuit 220 may be turned off, the first reception clock signal RCLK may be kept to a logic low level according to a logic level of the clock signal CLK, and the second reception clock signal FCLK may transition to a logic high level according to a logic level of the complementary clock signal CLKB. When the second reception clock signal FCLK transitions to a logic high level, there may be formed a current path between the second output node OP2 of the data buffer circuit 410 and the node, to which is the first power voltage VL is provided, and there may occur the kick-back noise. Due to the kick-back noise, a voltage level of the reference voltage VREF may drop. When the switching enable signal BEN is enabled, the noise compensator 420 may turn on the seventh transistor T27 and may provide second power voltage VH to the eighth transistor T28 to raise a voltage level of the reference voltage VREF and compensate for the voltage level drop of the reference voltage VREF due to the kick-back noise.

After that, when the clock signal CLK and the complementary clock signal CLKB toggle for a first time-amount T1, the first reception clock signal RCLK and the second reception clock signal FCLK may also toggle according to the clock signal CLK and the complementary clock signal CLKB. When the first time-amount T1 elapses, data DQ<1: 2> may be input. Although FIG. 5 exemplifies the first time-amount T1 as an amount of time corresponding to two periods of the clock signal CLK, the embodiment does not limit the first time-amount T1 to a specific amount of time. The first time-amount T1 may correspond to one period of the clock signal CLK, one and half periods of the clock signal CLK, or a different fractional or whole number multiplied by the period of the clock signal CLK. The first data receiver 120 may compare a first data signal D1 within the data DQ<1:2> with the reference voltage VREF in synchronization with a rising edge of the first reception clock signal RCLK to generate the first internal data signal DIN1. The second data receiver 130 may compare a second data signal D2 within the data DQ<1:2> with the reference voltage VREF in synchronization with a rising edge of the second reception clock signal FCLK to generate the second internal data signal DIN2. When the transmission of the data DQ<1:2> is completed, the clock signal CLK and the complementary clock signal CLKB may additionally toggle for a second time-amount T2. Although FIG. 5 exemplifies the second time-amount T2 as an amount of time corresponding to one and half periods of the clock signal CLK, the embodiment does not limit the second time-amount T2 to a specific amount of time. The second time-amount T2 may correspond to one period of the clock signal CLK, two periods of the clock signal CLK, or a different fractional or whole number multiplied by the period of the clock signal CLK.

When the second time-amount T2 elapses, the clock signal CLK may be kept to a logic low level, and the complementary clock signal CLKB may be kept to a logic high level. Therefore, the first reception clock signal RCLK may be kept to a logic low level and the second reception clock signal FCLK may be kept to a logic high level. When the switching enable signal BEN is disabled, the deterioration preventing circuit 220 may be turned on and the clock receiver 110 may keep the first reception clock signal RCLK and the second reception clock signal FCLK to a logic low level. As the second reception clock signal FCLK transitions from a logic high level to a logic low level, there may be formed a current path between the node, to which the second power voltage VH is provided, and the second output node OP2 of the data buffer circuit 410 and there may occur the kick-back noise. Due to the kick-back noise, a voltage level of the reference voltage VREF may rise. When the switching enable signal BEN is disabled, the noise compensator 420 may turn on the sixth transistor T26 and may provide the first power voltage VL to the eighth transistor T28 to lower a voltage level of the reference voltage VREF and compensate for the voltage level rise of the reference voltage VREF due to the kick-back noise.

Figure 6:
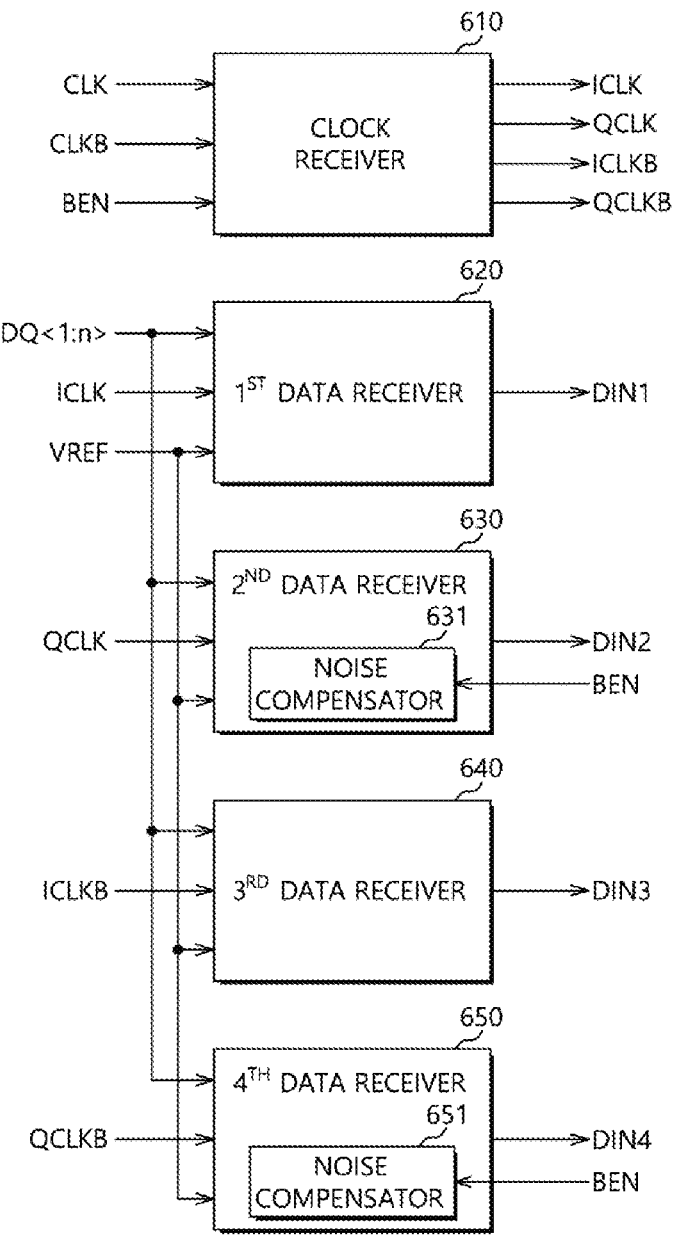
FIG. 6 is a diagram illustrating a configuration of a data receiving device in accordance with an embodiment.

FIG. 6 is a diagram illustrating configuration of a data receiving device 600 in accordance with an embodiment. Referring to FIG. 6, the data receiving device 600 may include a clock receiver 610 and a plurality of data receivers. The clock receiver 610 may receive a clock signal CLK and a complementary clock signal CLKB. The clock receiver 610 may generate a plurality of reception clock signals based on the clock signal CLK and the complementary clock signal CLKB. The clock receiver 610 may further receive a switching enable signal BEN. The clock receiver 610 may generate, based on the switching enable signal BEN, the plurality of reception clock signals from the clock signal CLK and the complementary clock signal CLKB. The clock receiver 610 may generate all the plurality of reception clock signals having the same logic level when the switching enable signal BEN is disabled. When the switching enable signal BEN is enabled, the clock receiver 610 may change logic levels of at least a part among the plurality of reception clock signals. When the switching enable signal BEN is enabled, the clock receiver 610 may generate the plurality of reception clock signals according to the clock signal CLK and the complementary clock signal CLKB. When the switching enable signal BEN is disabled, the clock receiver 610 may change logic levels of at least the part among the plurality of reception clock signals and the rest among the plurality of reception clock signals may be kept to have the same logic level.

The clock receiver 610 may receive the clock signal CLK, the complementary clock signal CLKB, and the switching enable signal BEN to generate a first reception clock signal ICLK, a second reception clock signal QCLK, a third reception clock signal ICLKB, and a fourth reception clock signal QCLKB. Although FIG. 6 exemplifies the four reception clock signals, a number of the reception clock signals may be greater than four. The first to fourth reception clock signals ICLK, QCLK, ICLKB, and QCLKB may be generated by dividing frequency of the clock signal CLK and the complementary clock signal CLKB. For example, a frequency of the first to fourth reception clock signals ICLK, QCLK, ICLKB, and QCLKB may be half the frequency of the clock signal CLK and/or the complementary clock signal CLKB. For example, a period of the first to fourth reception clock signals ICLK, QCLK, ICLKB, and QCLKB may be double the period of the clock signal CLK and/or the complementary clock signal CLKB. The first reception clock signal ICLK and the third reception clock signal ICLKB may be synchronized with the phase of the clock signal CLK. The second reception clock signal QCLK and the fourth reception clock signal QCLKB may be synchronized with the phase of the complementary clock signal CLKB. The first reception clock signal ICLK may have a phase leading the second reception clock signal QCLK by an amount of 90°. The second internal clock signal QCLK may have a phase leading the third internal clock signal ICLKB by an amount of 90°. The third internal clock signal ICLKB may have a phase leading the fourth internal clock signal QCLKB by an amount of 90°. The fourth internal clock signal QCLKB may have a phase leading the first internal clock signal ICLK by an amount of 90°.

The clock receiver 610 may generate, when the switching enable signal BEN is disabled, the first to fourth reception clock signals ICLK, QCLK, ICLKB, and QCLKB having a logic low level. When the switching enable signal BEN is enabled, the clock receiver 610 may change logic levels of the second reception clock signal QCLK and the fourth reception clock signal QCLKB to a logic high level and may keep the first reception clock signal ICLK and the third reception clock signal ICLKB to a logic low level. When the switching enable signal BEN is enabled, the clock receiver 610 may generate the first reception clock signal ICLK and the third reception clock signal ICLKB having a logic level corresponding to the clock signal CLK and may generate the second reception clock signal QCLK and the fourth reception clock signal QCLKB having a logic level corresponding to the complementary clock signal CLKB. When the switching enable signal BEN is disabled, the clock receiver 610 may change logic levels of the second reception clock signal QCLK and the fourth reception clock signal QCLKB to a logic low level and thus all the first to fourth reception clock signals ICLK, QCLK, ICLKB, and QCLKB may have a logic low level.

The plurality of data receivers may receive data DQ<1:n> based on the plurality of reception clock signals. The data DQ<1:n> may be one data stream including a plurality of data signals. The plurality of data signals may be serially and consecutively input to the plurality of data receivers. Each of the plurality of data signals may be a single-ended signal. The plurality of data receivers may utilize a reference voltage VREF in order to receive the data DQ<1:n>. The reference voltage VREF may have a voltage level corresponding to a middle of a range that the data DQ<1:n> swings. The plurality of data receivers may compare the data DQ<1:n> with the reference voltage VREF in synchronization with corresponding reception clock signals, respectively, to generate a plurality of internal data signals. A data receiver receiving the reception clock signal of which a logic level transitions when a logic level of the switching enable signal BEN transitions among the plurality of data receivers may compensate for level change of the reference voltage VREF based on the switching enable signal BEN. Data receivers operating in synchronization with at least the partial reception clock signals among the plurality of data receivers may change a voltage level of the reference voltage VREF when a logic level of the switching enable signal BEN transitions. There may occur the kick-back noise in a data receiver receiving a reception clock signal, a logic level of which transitions according to the transition of a logic level of the switching enable signal BEN. There might not occur the kick-back noise in a data receiver receiving a reception clock signal, a logic level of which does not transition according to the transition of a logic level of the switching enable signal BEN. Therefore, the data receiving device 600 may control only a data receiver, in which there may occur the kick-back noise among the plurality of data receivers, to compensate for a voltage level of the reference voltage VREF thereby reducing an occupied circuit space of the data receiving device 600 and minimizing power consumption of the data receiving device 600.

The data receiving device 600 may further include a first data receiver 620, a second data receiver 630, a third data receiver 640, and a fourth data receiver 650. The data DQ<1:n> may include n number of data signals, where n is an integer equal to or greater than 2. The first data receiver 620 may receive the data DQ<1:n>, the first reception clock signal ICLK, and the reference voltage VREF to generate a first internal data signal DIN1. The first data receiver 620 may compare the data DQ<1:n> with the reference voltage VREF in synchronization with the first reception clock signal ICLK to generate the first internal data signal DIN1. The second data receiver 630 may receive the data DQ<1:n>, the second reception clock signal QCLK, and the reference voltage VREF to generate a second internal data signal DIN2. The second data receiver 630 may compare the data DQ<1:n> with the reference voltage VREF in synchronization with the second reception clock signal QCLK to generate the second internal data signal DIN2. The third data receiver 640 may receive the data DQ<1:n>, the third reception clock signal ICLKB, and the reference voltage VREF to generate a third internal data signal DIN3. The third data receiver 640 may compare the data DQ<1:n> with the reference voltage VREF in synchronization with the third reception clock signal ICLKB to generate the third internal data signal DIN3. The fourth data receiver 650 may receive the data DQ<1:n>, the fourth reception clock signal QCLKB, and the reference voltage VREF to generate a fourth internal data signal DIN4. The fourth data receiver 650 may compare the data DQ<1:n> with the reference voltage VREF in synchronization with the fourth reception clock signal QCLKB to generate the fourth internal data signal DIN4. The first data receiver 620 and the third data receiver 640 may have substantially the same configuration as the first data receiver 120 illustrated in FIGS. 1 and 3. The second data receiver 630 and the fourth data receiver 650 may have substantially the same configuration as the second data receiver 130 illustrated in FIGS. 1 and 4.

The second data receiver 630 may further receive the switching enable signal BEN. The second data receiver 630 may compensate for a level change of the reference voltage VREF when a logic level of the switching enable signal BEN transitions. The second data receiver 630 may include a noise compensator 631. The noise compensator 631 may receive the switching enable signal BEN. The noise compensator 631 may change a voltage level of the reference voltage VREF based on the switching enable signal BEN. For example, when the switching enable signal BEN is enabled and a logic level of the second reception clock signal QCLK transitions to a logic high level, the noise compensator 631 may raise a voltage level of the reference voltage VREF. For example, when the switching enable signal BEN is disabled and a logic level of the second reception clock signal QCLK transitions to a logic low level, the noise compensator 631 may lower a voltage level of the reference voltage VREF. The fourth data receiver 650 may further receive the switching enable signal BEN. The fourth data receiver 650 may compensate for a level change of the reference voltage VREF when a logic level of the switching enable signal BEN transitions. The fourth data receiver 650 may include a noise compensator 651. The noise compensator 651 may receive the switching enable signal BEN. The noise compensator 651 may change a voltage level of the reference voltage VREF based on the switching enable signal BEN. For example, when the switching enable signal BEN is enabled and a logic level of the fourth reception clock signal QCLKB transitions to a logic high level, the noise compensator 651 may raise a voltage level of the reference voltage VREF. For example, when the switching enable signal BEN is disabled and a logic level of the fourth reception clock signal QCLKB transitions to a logic low level, the noise compensator 651 may lower a voltage level of the reference voltage VREF.

Figure 7:
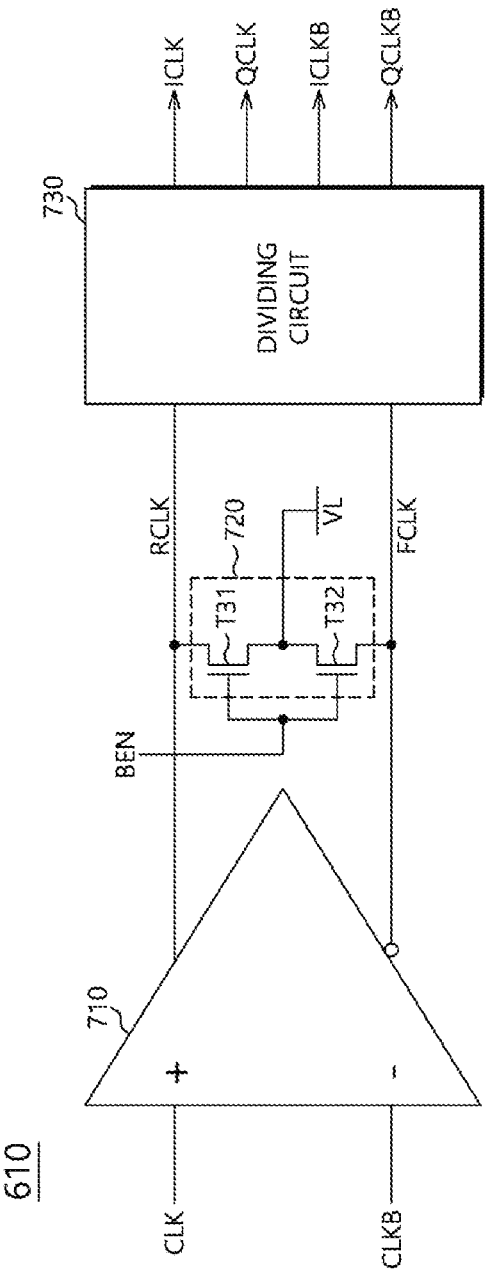
FIG. 7 is a diagram illustrating a configuration of a clock receiver illustrated in FIG. 6.

FIG. 7 is a diagram illustrating configuration of the clock receiver 610 illustrated in FIG. 6. Referring to FIG. 7, the clock receiver 610 may include a clock buffer circuit 710, a deterioration preventing circuit 720, and a dividing circuit 730. The clock buffer circuit 710 may receive the clock signal CLK and the complementary clock signal CLKB. The clock buffer circuit 710 may generate a rising clock signal RCLK and a falling clock signal FCLK. The clock buffer circuit 710 may differentially amplify the clock signal CLK and the complementary clock signal CLKB to generate the rising clock signal RCLK and the falling clock signal FCLK. The rising clock signal RCLK may have a logic level corresponding to the clock signal CLK. The falling clock signal FCLK may have a logic level corresponding to the complementary clock signal CLKB. The clock buffer circuit 710 may receive the clock signal CLK through a positive input node and may receive the complementary clock signal CLKB through a negative input node. The clock buffer circuit 710 may output the rising clock signal RCLK through a positive output node and may output the falling clock signal FCLK through a negative output node.

The deterioration preventing circuit 720 may receive the switching enable signal BEN. The deterioration preventing circuit 720 may change, based on the switching enable signal BEN, logic levels of the rising clock signal RCLK and the falling clock signal FCLK. When the switching enable signal BEN is disabled, the deterioration preventing circuit 720 may control the rising clock signal RCLK and the falling clock signal FCLK to have the same logic level regardless of logic levels of the clock signal CLK and the complementary clock signal CLKB. When the switching enable signal BEN is enabled, the deterioration preventing circuit 720 may control to generate the rising clock signal RCLK according to the clock signal CLK and to generate the falling clock signal FCLK according to the complementary clock signal CLKB. The deterioration preventing circuit 720 may include a first transistor T31 and a second transistor T32. Each of the first transistor T31 and the second transistor T32 may be an N-channel MOS transistor. The first transistor T31 may be coupled between the positive output node of the clock buffer circuit 710 and a node, to which a first power voltage VL is provided, and may receive the switching enable signal BEN at its gate. The second transistor T32 may be coupled between the negative output node of the clock buffer circuit 710 and the node to, which the first power voltage VL is provided, and may receive the switching enable signal BEN at its gate. When the switching enable signal BEN is disabled, the first transistor T31 and the second transistor T32 may be turned on. The first transistor T31 and the second transistor T32 may couple the positive output node and the negative output node of the clock buffer circuit 710 to each other and may drive both the rising clock signal RCLK and the falling clock signal FCLK to a voltage level corresponding to the first power voltage VL. When the switching enable signal BEN is enabled, the first transistor T31 and the second transistor T32 may be turned off and the coupling between the positive output node and the negative output node of the clock buffer circuit 710 may be released. Therefore, the rising clock signal RCLK may have a logic level corresponding to the clock signal CLK and the falling clock signal FCLK may have a logic level corresponding to the complementary clock signal CLKB.

The dividing circuit 730 may receive the rising clock signal RCLK and the falling clock signal FCLK to generate the first to fourth reception clock signals ICLK, QCLK, ICLKB, and QCLKB. The dividing circuit 730 may divide the frequency of the rising clock signal RCLK and the falling clock signal FCLK to generate the first to fourth reception clock signals ICLK, QCLK, ICLKB, and QCLKB. The dividing circuit 730 may divide the rising clock signal RCLK to generate the first reception clock signal ICLK and the third reception clock signal ICLKB. The dividing circuit 730 may divide the falling clock signal FCLK to generate the second reception clock signal QCLK and the fourth reception clock signal QCLKB.

Figure 8:
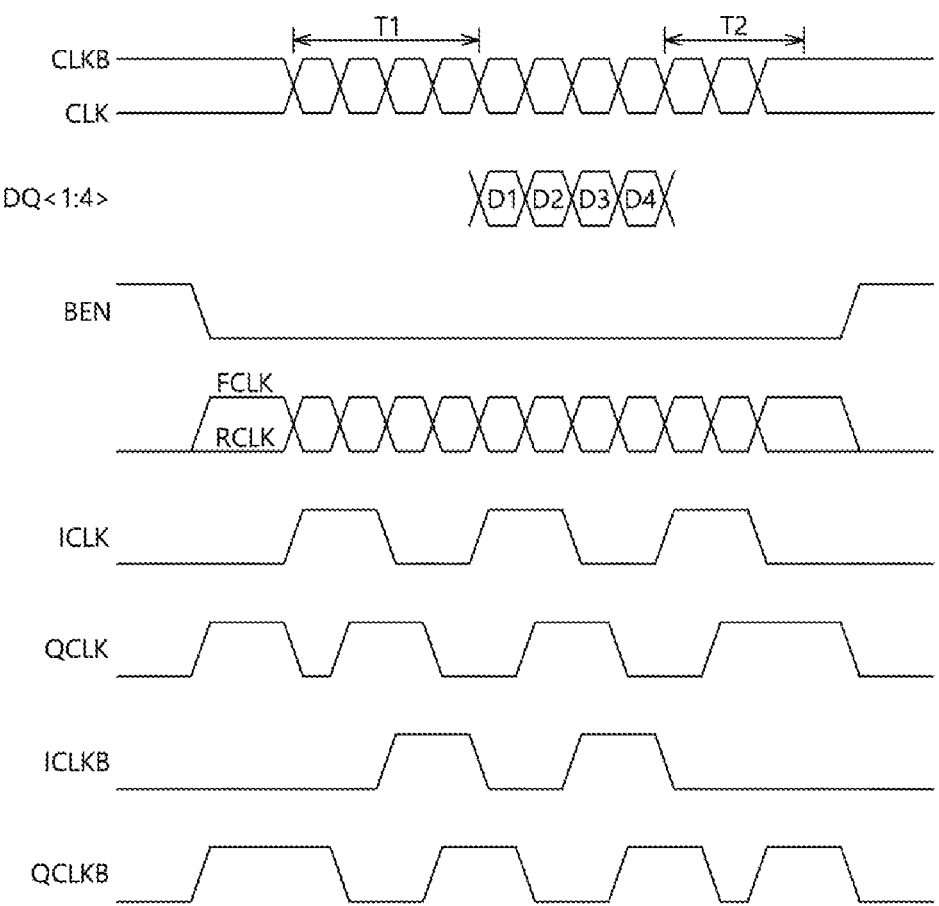
FIG. 8 is a timing diagram illustrating an operation of a data receiving device in accordance with an embodiment.

FIG. 8 is a timing diagram illustrating an operation of the data receiving device 600 in accordance with an embodiment. Hereinafter, described with reference to FIGS. 6 to 8 will be the operation of the data receiving device 600 in accordance with an embodiment. Referring to FIG. 8, it is assumed for clear description that four data signals are consecutively input to the data receiving device 600. The switching enable signal BEN may be disabled before the data DQ<1:n> is transmitted. The clock signal CLK may have a logic low level and the complementary clock signal CLKB may have a logic high level. The deterioration preventing circuit 720 of the data receiving device 600 may drive, based on the switching enable signal BEN, both the rising clock signal RCLK and the falling clock signal FCLK to a logic low level and all the first to fourth reception clock signals ICLK, QCLK, ICLKB, and QCLKB may have a logic low level. Therefore, the first to fourth data receivers 620, 630, 640, and 650 may be deteriorated by the same degree as one another. When the switching enable signal BEN is enabled, the deterioration preventing circuit 720 may release the coupling between the rising clock signal RCLK and the falling clock signal FCLK. The rising clock signal RCLK may be kept to a logic low level according to the clock signal CLK. The falling clock signal FCLK may transition to a logic high level according to the complementary clock signal CLKB. Therefore, the first reception clock signal ICLK and the third reception clock signal ICLKB may be kept to a logic low level and the second reception clock signal QCLK and the fourth reception clock signal QCLKB may transition to a logic high level. As the second reception clock signal QCLK and the fourth reception clock signal QCLKB transition, there may occur the kick-back noise in the second data receiver 630 and the fourth data receiver 650 receiving the second reception clock signal QCLK and the fourth reception clock signal QCLKB. Due to the kick-back noise, a voltage level of the reference voltage VREF may drop. The noise compensators 631 and 651 of the second data receiver 630 and the fourth data receiver 650 may raise, when the switching enable signal BEN is enabled, a voltage level of the reference voltage VREF to compensate for the voltage level drop of the reference voltage VREF due to the kick-back noise.

After that, the clock signal CLK and the complementary clock signal CLKB may toggle while having opposite logic levels for a first time-amount T1. When the first time-amount T1 elapses, the data DQ<1:4> may be input. The data DQ<1:4> may be transmitted in synchronization with the clock signal CLK and the complementary clock signal CLKB. The first data receiver 620 may compare a first data signal D1 within the data DQ<1:4> with the reference voltage VREF in synchronization with a rising edge of the first reception clock signal ICLK to generate the first internal data signal DIN1. The second data receiver 630 may compare a second data signal D2 within the data DQ<1:4> with the reference voltage VREF in synchronization with a rising edge of the second reception clock signal QCLK to generate the second internal data signal DIN2. The third data receiver 640 may compare a third data signal D3 within the data DQ<1:4> with the reference voltage VREF in synchronization with a rising edge of the third reception clock signal ICLKB to generate the third internal data signal DIN3. The fourth data receiver 650 may compare a fourth data signal D4 within the data DQ<1:4> with the reference voltage VREF in synchronization with a rising edge of the fourth reception clock signal QCLKB to generate the fourth internal data signal DIN4. When assuming that the data DQ<1:n> includes six data signals, the first data receiver 620 may compare a fifth data signal D5 within the data DQ<1:6> with the reference voltage VREF in synchronization with the first reception clock signal ICLK again to generate the first internal data signal DIN1. The second data receiver 630 may compare a sixth data signal D6 within the data DQ<1:6> with the reference voltage VREF in synchronization with the second reception clock signal QCLK again to generate the second internal data signal DIN2. When assuming that the data DQ<1:n> includes three data signals, the first data receiver 620, the second data receiver 630 and the third data receiver 640 may receive first to third data signals D1 to D3 within the data DQ<1:3> to generate the first internal data signal DIN1, the second internal data signal DIN2 and the third internal data signal DIN3, respectively, and the fourth data receiver 650 might not generate the fourth internal data signal DIN4 from the data DQ<1:3>.

When the transmission of the data DQ<1:4> is completed, the clock signal CLK and the complementary clock signal CLKB may additionally toggle for a second time-amount T2. When the second time-amount T2 elapses, the clock signal CLK may be kept to a logic low level again and the complementary clock signal CLKB may be kept to a logic high level again. Therefore, the first reception clock signal ICLK and the third reception clock signal ICLKB may be kept to a logic low level and the second reception clock signal QCLK and the fourth reception clock signal QCLKB may be kept to a logic high level. When the switching enable signal BEN is disabled, the deterioration preventing circuit 720 may drive both the rising clock signal RCLK and the falling clock signal FCLK to a logic low level. Therefore, the first reception clock signal ICLK and the third reception clock signal ICLKB may be kept to a logic low level but the second reception clock signal QCLK and the fourth reception clock signal QCLKB may transition from a logic high level to a logic low level. As the second reception clock signal QCLK and the fourth reception clock signal QCLKB transition, there may occur the kick-back noise in the second data receiver 630 and the fourth data receiver 650 receiving the second reception clock signal QCLK and the fourth reception clock signal QCLKB. Due to the kick-back noise, a voltage level of the reference voltage VREF may rise. The noise compensators 631 and 651 of the second data receiver 630 and the fourth data receiver 650 may lower, when the switching enable signal BEN is disabled, a voltage level of the reference voltage VREF to compensate for the voltage level rise of the reference voltage VREF due to the kick-back noise.

Figure 9:
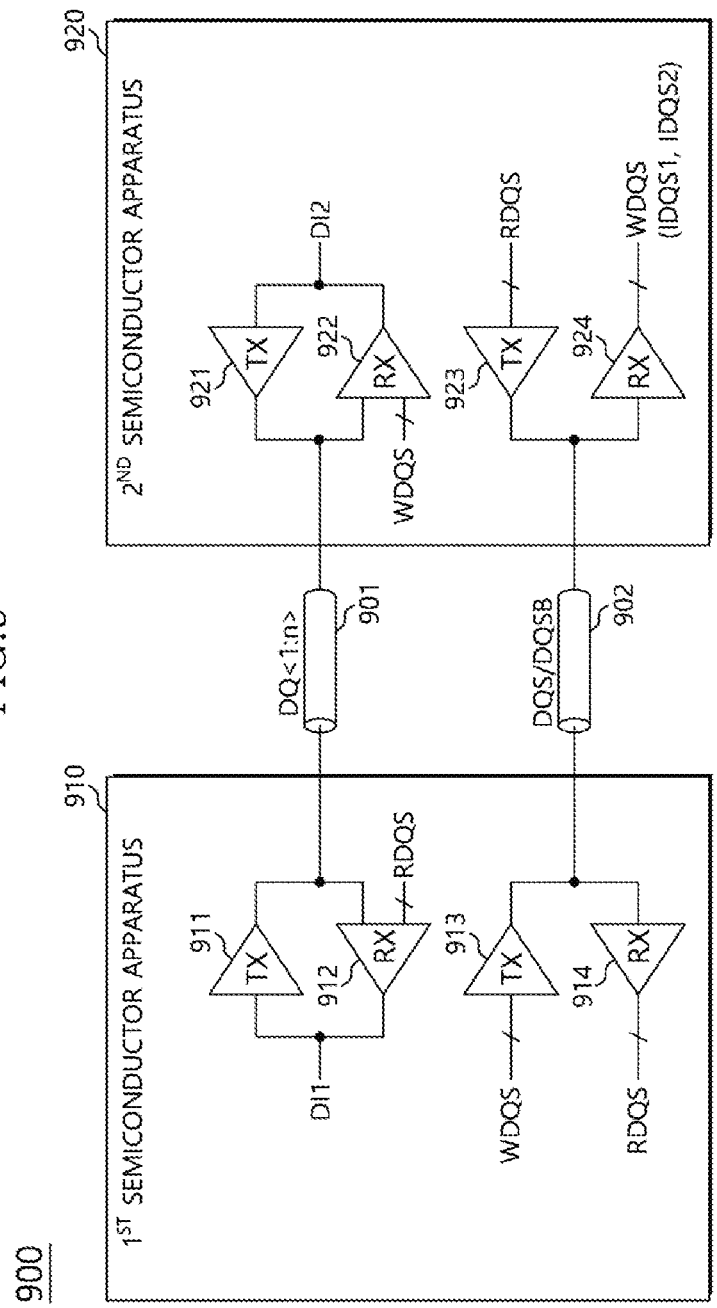
FIG. 9 is a diagram illustrating a configuration of a semiconductor system in accordance with an embodiment.

FIG. 9 is a diagram illustrating configuration of a semiconductor system 900 in accordance with an embodiment. Referring to FIG. 9, the semiconductor system 900 may include a first semiconductor apparatus 910 and a second semiconductor apparatus 920. The first semiconductor apparatus 910 may be a master device configured to provide various control signals required for the second semiconductor apparatus 920 to operate. The second semiconductor apparatus 920 may be a slave device configured to perform various operations under the control of the first semiconductor apparatus 910. The first semiconductor apparatus 910 may include various types of host devices. For example, the first semiconductor apparatus 910 may include a central processing unit (CPU), a graphic processing unit (GPU), a multi-media processor (MMP), a digital signal processor, an application processor (AP), and a memory controller. For example, the second semiconductor apparatus 920 may be a memory device and the memory device may include a volatile memory and a non-volatile memory. The volatile memory may include a static random access memory (static RAM: SRAM), a dynamic RAM (DRAM), and a synchronous DRAM (SDRAM). The non-volatile memory may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM), and so forth.

The second semiconductor apparatus 920 may be coupled to the first semiconductor apparatus 910 through a plurality of buses. The plurality of buses may be a signal transmission path, a link, or a channel for transferring a signal. The plurality of buses may include a data bus 901 and a data strobe bus 902. Each of the data bus 901 and the data strobe bus 902 may be a two-way bus. The data bus 901 may include a plurality of data transmission lines. A plurality of data DQ<1:n> may be transmitted through the plurality of data transmission lines. Each of the plurality of data DQ<1:n> may include a plurality of data signals to be serially transmitted. FIG. 9 illustrates data DQ<1:n> to be transmitted through one signal transmission line, where n is an integer equal to or greater than 2. The data DQ<1:n> may include a plurality of data signals to be serially and consecutively transmitted. The data strobe bus 902 may include a plurality of data strobe transmission lines. The first semiconductor apparatus 910 and the second semiconductor apparatus 920 may perform a write operation and a read operation through the data bus 901 and the data strobe bus 902. The write operation may be an operation that the first semiconductor apparatus 910 transmits the data DQ<1:n> to the second semiconductor apparatus 920. The read operation may be an operation that the second semiconductor apparatus 920 transmits the data DQ<1:n> to the first semiconductor apparatus 910. During the write operation, the first semiconductor apparatus 910 may transmit the data DQ<1:n> to the second semiconductor apparatus 920 through the data bus 901. The first semiconductor apparatus 910 may transmit a data strobe signal DQS and a complementary data strobe signal DQSB to the second semiconductor apparatus 920 through the data strobe bus 902. During the read operation, the second semiconductor apparatus 920 may transmit the data DQ<1:n> to the first semiconductor apparatus 910 through the data bus 901. The second semiconductor apparatus 920 may transmit the data strobe signal DQS and the complementary data strobe signal DQSB to the first semiconductor apparatus 910 through the data strobe bus 902. The data strobe signal DQS and the complementary data strobe signal DQSB may respectively correspond to the clock signal CLK and the complementary clock signal CLKB illustrated in FIGS. 1 and 6. Although not illustrated, the second semiconductor apparatus 920 may be coupled to the first semiconductor apparatus 910 through a command bus, an address bus, a clock bus and so forth. Each of the command bus, the address bus and the clock bus may be a single-ended signal. The first semiconductor apparatus 910 may provide the second semiconductor apparatus 920 with a command signal through the command bus. The first semiconductor apparatus 910 may provide the second semiconductor apparatus 920 with an address signal through the address bus. The first semiconductor apparatus 910 may provide the second semiconductor apparatus 920 with a system clock signal through the clock bus.

The first semiconductor apparatus 910 may include a data transmitting circuit (TX) 911, a data receiving circuit (RX) 912, a strobe transmitting circuit (TX) 913, and a strobe receiving circuit (RX) 914. The data transmitting circuit 911 may be coupled to the data bus 901. The data transmitting circuit 911 may drive the data bus 901 based on internal data DI1 of the first semiconductor apparatus 910. The data transmitting circuit 911 may transmit the data DQ<1:n> through the data bus 901. The data receiving circuit 912 may be coupled to the data bus 901. The data receiving circuit 912 may receive the data DQ<1:n> transmitted from the second semiconductor apparatus 920 through the data bus 901. The data receiving circuit 912 may generate the internal data DI1 of the first semiconductor apparatus 910 based on the data DQ<1:n>. The strobe transmitting circuit 913 may be coupled to the data strobe bus 902. The strobe transmitting circuit 913 may drive the data strobe bus 902 based on a write data strobe signal WDQS. The strobe transmitting circuit 913 may transmit the data strobe signal DQS and the complementary data strobe signal DQSB to the second semiconductor apparatus 920 through the data strobe bus 902. The strobe receiving circuit 914 may be coupled to the data strobe bus 902. The strobe receiving circuit 914 may receive the data strobe signal DQS and the complementary data strobe signal DQSB transmitted from the second semiconductor apparatus 920 through the data strobe bus 902. The strobe receiving circuit 914 may generate a read data strobe signal RDQS based on the data strobe signal DQS and the complementary data strobe signal DQSB. The data DQ<1:n> output from the data transmitting circuit 911 and the data strobe signal DQS output from the strobe transmitting circuit 913 may be synchronized with each other. The data DQ<1:n> transmitted from the second semiconductor apparatus 920 and the data strobe signal DQS may be synchronized with each other. The data receiving circuit 912 may sample, based on the read data strobe signal RDQS, the data DQ<1:n> received through the data bus 901.

The second semiconductor apparatus 920 may include a data transmitting circuit (TX) 921, a data receiving circuit (RX) 922, a strobe transmitting circuit (TX) 923, and a strobe receiving circuit (RX) 924. The data transmitting circuit 921 may be coupled to the data bus 901. The data transmitting circuit 921 may drive the data bus 901 based on internal data D12 of the second semiconductor apparatus 920. The data transmitting circuit 921 may transmit the data DQ<1:n> through the data bus 901. The data receiving circuit 922 may be coupled to the data bus 901. The data receiving circuit 922 may receive the data DQ<1:n> transmitted from the first semiconductor apparatus 910 through the data bus 901. The data receiving circuit 922 may generate the internal data D12 of the second semiconductor apparatus 920 based on the data DQ<1:n>. The strobe transmitting circuit 923 may be coupled to the data strobe bus 902. The strobe transmitting circuit 923 may drive the data strobe bus 902 based on the read data strobe signal RDQS. The strobe transmitting circuit 923 may transmit the data strobe signal DQS and the complementary data strobe signal DQSB to the first semiconductor apparatus 910 through the data strobe bus 902. The strobe receiving circuit 924 may be coupled to the data strobe bus 902. The strobe receiving circuit 924 may receive the data strobe signal DQS and the complementary data strobe signal DQSB transmitted from the first semiconductor apparatus 910 through the data strobe bus 902. The strobe receiving circuit 924 may generate the write data strobe signal WDQS based on the data strobe signal DQS and the complementary data strobe signal DQSB. The data DQ<1:n> output from the data transmitting circuit 921 and the data strobe signal DQS output from the strobe transmitting circuit 923 may be synchronized with each other. The data DQ<1:n> transmitted from the first semiconductor apparatus 910 and the data strobe signal DQS may be synchronized with each other. The data receiving circuit 922 may sample, based on the write data strobe signal WDQS, the data DQ<1:n> received through the data bus 901.

A combination of the data receiving circuit 922 and the strobe receiving circuit 924 of the second semiconductor apparatus 920 may correspond to at least one between the data receiving devices 100 and 600 illustrated in FIGS. 1 and 6. The write data strobe signal WDQS generated from the data strobe signal DQS and the complementary data strobe signal DQSB may include a first internal strobe signal IDQS1 and a second internal strobe signal IDQS2. The first internal strobe signal IDQS1 and the second internal strobe signal IDQS2 may respectively correspond to the first reception clock signal RCLK and the second reception clock signal FCLK illustrated in FIG. 1. In an embodiment, the strobe receiving circuit 924 may divide a frequency of the data strobe signal DQS and the complementary data strobe signal DQSB to generate four or more internal strobe signals. For example, the strobe receiving circuit 924 may halve the frequency of the data strobe signal DQS and the complementary data strobe signal DQSB to generate four internal strobe signals. The four internal strobe signals may respectively correspond to the first to fourth reception clock signals ICLK, QCLK, ICLKB, and QCLKB illustrated in FIG. 6. The strobe receiving circuit 924 may include the clock receiver 110 illustrated in FIG. 1. The data receiving circuit 922 may include the first data receiver 120 and the second data receiver 130 illustrated in FIG. 1. In an embodiment, the strobe receiving circuit 924 may include the clock receiver 610 illustrated in FIG. 6. In an embodiment, the data receiving circuit 922 may include the first to fourth data receivers 620, 630, 640, and 650 illustrated in FIG. 6. At least one between the data receiving devices 100 and 600 illustrated in FIGS. 1 and 6 may be applied as the data receiving circuit 912 and the strobe receiving circuit 914 of the first semiconductor apparatus 910. The read data strobe signal RDQS generated from the data strobe signal DQS may include the first reception clock signal RCLK and the second reception clock signal FCLK illustrated in FIG. 1 or the first to fourth reception clock signals ICLK, QCLK, ICLKB, and QCLKB illustrated in FIG. 6. The data receiving circuit 912 may include the first data receiver 120 and the second data receiver 130 illustrated in FIG. 1 or the first to fourth data receivers 620, 630, 640, and 650 illustrated in FIG. 6.

Figure 10:
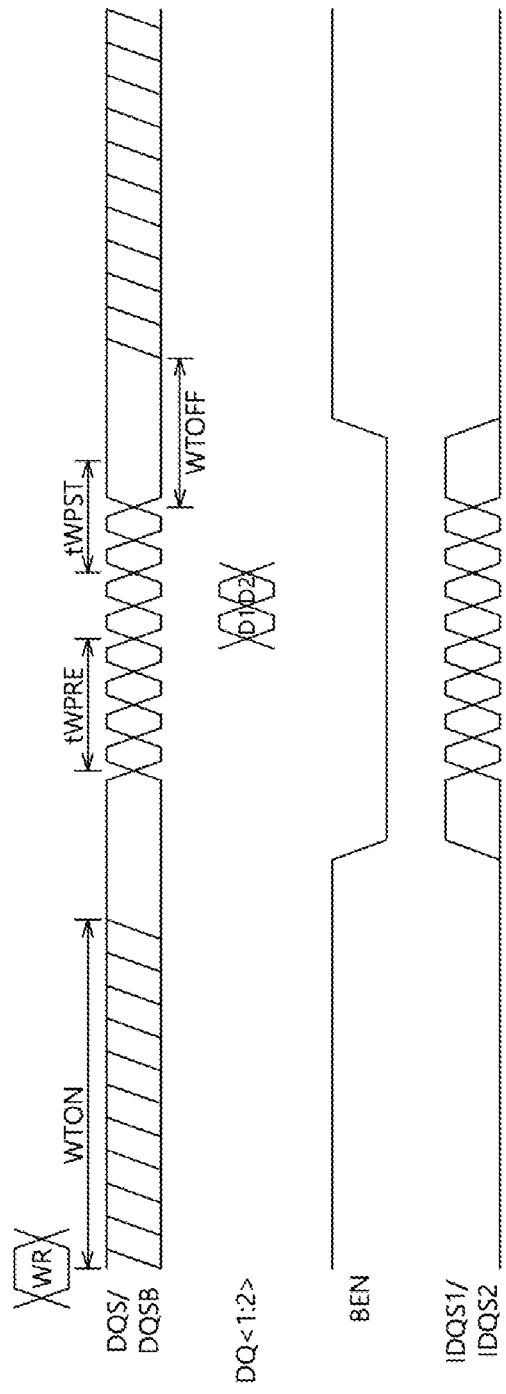
FIG. 10 is a timing diagram illustrating an operation of a semiconductor system in accordance with an embodiment.

FIG. 10 is a timing diagram illustrating an operation of the semiconductor system 900 in accordance with an embodiment. Hereinafter, described with reference to FIGS. 9 and 10 will be a write operation in accordance with an embodiment. It is exemplified that data DQ<1:2> including two data signals is transmitted from the first semiconductor apparatus 910 in the write operation. For the write operation, the first semiconductor apparatus 910 may transmit a write command signal WR to the second semiconductor apparatus 920. When a write-on time WTON elapses after the write command signal WR is transmitted, the first semiconductor apparatus 910 may transmit the data strobe signal DQS having a logic low level and the complementary data strobe signal DQSB having a logic high level. Because the switching enable signal BEN is not enabled yet, the second semiconductor apparatus 920 may keep both logic levels of the first internal strobe signal IDQS1 and the second internal strobe signal IDQS2 to a logic low level even when the data strobe signal DQS and the complementary data strobe signal DQSB having opposite logic levels are transmitted. The second semiconductor apparatus 920 may keep both logic levels of the first internal strobe signal IDQS1 and the second internal strobe signal IDQS2 to the same level thereby causing the plurality of data receivers configuring the data receiving circuit 922 to be deteriorated by the same degree as one another.

When the switching enable signal BEN is enabled, the first internal strobe signal IDQS1 may have a logic level corresponding to the data strobe signal DQS and the second internal strobe signal IDQS2 may have a logic level corresponding to the complementary data strobe signal DQSB. At this time, the first internal strobe signal IDQS1 may be kept to a logic low level while the second internal strobe signal IDQS2 may transition from a logic low level to a logic high level. When the logic level of the second internal strobe signal IDQS2 transitions, the kick-back noise may occur in a data receiver configured to receive the second internal strobe signal IDQS2 among the plurality of data receivers configuring the data receiving circuit 922. The data receiver configured to receive the second internal strobe signal IDQS2 may compensate for the kick-back noise when the switching enable signal BEN is enabled.

After that, the data strobe signal DQS and the complementary data strobe signal DQSB may toggle to respectively have opposite logic levels. Therefore, the first internal strobe signal IDQS1 and the second internal strobe signal IDQS2 may also toggle to respectively have opposite logic levels. While the first internal strobe signal IDQS1 and the second internal strobe signal IDQS2 keep toggling to respectively opposite logic levels, the kick-back noise occurring in one data receiver and the kick-back noise occurring in the other data receiver may offset each other. When a preamble time tWPRE elapses, the DQ<1:2> may be transmitted from the first semiconductor apparatus 910 to the second semiconductor apparatus 920. A data receiver configured to receive the first internal strobe signal IDQS1 may compare a first data signal D1 of the DQ<1:2> with the reference voltage VREF in synchronization with a rising edge of the first internal strobe signal IDQS1 to generate the internal data DI2. A data receiver configured to receive the second internal strobe signal IDQS2 may compare a second data signal D2 of the DQ<1:2> with the reference voltage VREF in synchronization with a rising edge of the second internal strobe signal IDQS2 to generate the internal data DI2. When the transmission of the DQ<1:2> is completed and a postamble time tWPST elapses, the data strobe signal DQS may be kept to a logic low level and the complementary data strobe signal DQSB may be kept to a logic high level. During an amount of time corresponding to a write-off time WTOFF, the first internal strobe signal IDQS1 may be kept to a logic low level and the second internal strobe signal IDQS2 may be kept to a logic high level.

When the switching enable signal BEN is disabled, the strobe receiving circuit 924 may drive both the first internal strobe signal IDQS1 and the second internal strobe signal IDQS2 to a logic low level thereby causing the plurality of data receivers configuring the data receiving circuit 922 to be deteriorated by the same degree as one another. At this time, the first internal strobe signal IDQS1 may be kept to a logic low level while the second internal strobe signal IDQS2 may transition from a logic high level to a logic low level. When the logic level of the second internal strobe signal IDQS2 transitions, the kick-back noise may occur in a data receiver configured to receive the second internal strobe signal IDQS2 among the plurality of data receivers configuring the data receiving circuit 922. The data receiver configured to receive the second internal strobe signal IDQS2 may compensate for the kick-back noise when the switching enable signal BEN is enabled.

While certain embodiments have been described above, it will be understood to those skilled in the art that the embodiments described serve as examples only. Accordingly, the data receiving device, the semiconductor apparatus, and the semiconductor system using the same relating to the present teachings are not limited to the described embodiments. Rather, the data receiving device, the semiconductor apparatus, and the semiconductor system using the same should only be limited in light of the claims that follow when taken in conjunction with the above description and accompanying drawings.

What is claimed is:

1. A data receiving device comprising:
   a clock receiver configured to generate a first reception clock signal and a second reception clock signal from a clock signal and a complementary clock signal based on a switching enable signal and configured to change a logic level of the first reception clock signal when a logic level of the switching enable signal transitions;
   a first data receiver configured to compare data with a reference voltage in synchronization with the first reception clock signal to generate first internal data; and
   a second data receiver configured to compare the data with the reference voltage in synchronization with the second reception clock signal to generate second internal data and configured to compensate for a voltage level change of the reference voltage based on the switching enable signal.

2. The data receiving device of claim 1,
   wherein the clock receiver is configured to generate the first reception clock signal and the second reception clock signal having the same logic level when the switching enable signal is disabled,
   wherein the clock receiver is configured to output the clock signal as the first reception clock signal and output the complementary clock signal as the second reception clock signal when the switching enable signal is enabled.

3. The data receiving device of claim 1, wherein the clock receiver includes:
   a clock buffer circuit configured to differentially amplify the clock signal and the complementary clock signal to generate the first reception clock signal and the second reception clock signal; and
   a deterioration preventing circuit configured to control the first reception clock signal and the second reception clock signal to have the same logic level when the switching enable signal is disabled.

4. The data receiving device of claim 1, wherein the first data receiver includes a data buffer circuit configured to differentially amplify the data and the reference voltage in synchronization with the first reception clock signal to generate the first internal data.

5. The data receiving device of claim 1, wherein the second data receiver includes:
   a data buffer circuit configured to differentially amplify the data and the reference voltage in synchronization with the second reception clock signal to generate the second internal data; and
   a noise compensator configured to change a voltage level of the reference voltage when the logic level of the switching enable signal transitions.

6. The data receiving device of claim 5, wherein the noise compensator is configured to raise the voltage level of the reference voltage when the switching enable signal is disabled and is configured to lower the voltage level of the reference voltage when the switching enable signal is disabled.

7. A data receiving device comprising:
  a clock receiver configured to generate a plurality of internal clock signals from a clock signal and a complementary clock signal based on a switching enable signal; and
  a plurality of data receivers configured to receive data and a reference voltage and configured to compare the data and the reference voltage in synchronization with the plurality of internal clock signals, respectively, to generate a plurality of internal data,
  wherein, among the plurality of data receivers, a data receiver receiving an internal clock signal, of which a logic level transitions signals when a logic level of the switching enable signal transitions, changes a voltage level of the reference voltage when the logic level of the switching enable signal transitions.

8. The data receiving device of claim 7, wherein the clock receiver is configured to generate the plurality of internal reception clock signals having the same logic level when the switching enable signal is disabled.

9. The data receiving device of claim 7, wherein the clock receiver is configured to change logic levels of at least partial internal clock signals among the plurality of internal clock signals when the switching enable signal is enabled and is configured to change the logic levels of the at least partial internal clock signals when the switching enable signal is disabled.

10. The data receiving device of claim 7, wherein the data receiver receiving the internal clock signal, of which the logic level transitions when the logic level of the switching enable signal transitions, is configured to raise a voltage level of the reference voltage when the switching enable signal is enabled and is configured to lower the voltage level of the reference voltage when the switching enable signal is disabled.

11. A semiconductor apparatus comprising:
  a strobe receiving circuit configured to generate a first internal strobe signal and a second internal strobe signal from a data strobe signal and a complementary data strobe signal based on a switching enable signal;
  a first data receiver configured to compare data with a reference voltage in synchronization with the first internal strobe signal to generate first internal data; and
  a second data receiver configured to compare the data with the reference voltage in synchronization with the second internal strobe signal to generate second internal data and configured to compensate for a voltage level change of the reference voltage based on the switching enable signal.

12. The semiconductor apparatus of claim 11,
  wherein the strobe receiving circuit is configured to generate the first internal strobe signal and the second internal strobe signal having the same logic level when the switching enable signal is disabled,
  wherein the strobe receiving circuit is configured to output the data strobe signal as the first internal strobe signal and output the complementary data strobe signal as the second internal strobe signal when the switching enable signal is enabled.

13. The semiconductor apparatus of claim 11, wherein the strobe receiving circuit includes:
  a clock buffer circuit configured to differentially amplify the data strobe signal and the complementary data strobe signal to generate the first internal strobe signal and the second internal strobe signal; and
  a deterioration preventing circuit configured to control the first internal strobe signal and the second internal strobe signal to have the same logic level when the switching enable signal is disabled.

14. The semiconductor apparatus of claim 11, wherein the first data receiver includes a data buffer circuit configured to differentially amplify the data and the reference voltage in synchronization with the first internal strobe signal to generate the first internal data.

15. The semiconductor apparatus of claim 11, wherein the second data receiver includes:
  a data buffer circuit configured to differentially amplify the data and the reference voltage in synchronization with the second internal strobe signal to generate the second internal data; and
  a noise compensator configured to change a voltage level of the reference voltage when a logic level of the switching enable signal transitions.

16. The semiconductor apparatus of claim 15, wherein the noise compensator is configured to raise the voltage level of the reference voltage when the switching enable signal is enabled and is configured to lower the voltage level of the reference voltage when the switching enable signal is disabled.

* * * * *